(12) United States Patent
McFee et al.

(10) Patent No.: US 6,322,660 B1
(45) Date of Patent: Nov. 27, 2001

(54) APPARATUS AND METHOD FOR REMOTE ENDPOINT DETECTION

(75) Inventors: Michael Patrick McFee; Stephanie Annette Grahn; Thien Tung Nguyen, all of Austin, TX (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/164,197

(22) Filed: Sep. 30, 1998

(51) Int. Cl.$^7$ ...................................................... C23F 1/02
(52) U.S. Cl. .............................................................. 156/345
(58) Field of Search ........................... 156/345; 427/8–10; 248/225.11, 309.1, 327; 385/60, 76, 77, 88, 92

(56) References Cited

U.S. PATENT DOCUMENTS

| | | | |
|---|---|---|---|
| 3,888,441 | * | 6/1975 | Rebentisch .............................. 248/73 |
| 4,414,697 | * | 11/1983 | Hartley ...................................... 7/107 |
| 4,569,458 | * | 2/1986 | Horsley ................................... 220/3.6 |
| 5,064,269 | * | 11/1991 | Rogers et al. ......................... 385/115 |
| 5,658,423 | * | 8/1997 | Angell et al. ............................. 438/9 |

* cited by examiner

Primary Examiner—Felisa Hiteshew
Assistant Examiner—Lan Vinh
(74) Attorney, Agent, or Firm—James A. Harrison; Bruce E. Garlick (57) ABSTRACT

A chromator for monitoring the end point of a plasma etching process is placed remotely from the window of a plasma etching chamber and is optically coupled to the window with a fiber optic cable bundle. The fiber optic cable bundle includes a first and a second bracket. Each bracket is specially designed to be compatible with existing chromator and plasma etching chambers. The first bracket, which attaches to the chamber, includes a plurality of slots for allowing the bracket to be axially and vertically adjusted to find the optimal optical point. Accordingly, the likelihood of the chromator properly detecting the end point is maximized. An inventive method a includes optically coupling the remotely located chromator by connecting a fiber optic cable bundle having a first bracket to the chamber, axially adjusting the bracket to find the optimal location for detecting the end point, and securing the first bracket to the chamber. The second bracket of the fiber optic cable bundle is connected to a chromator. Accordingly, light beams emitted from the chamber through the window are transmitted through the fiber optic cable bundle to the chromator for analysis.

8 Claims, 7 Drawing Sheets

APPARATUS AND METHOD FOR REMOTE ENDPOINT DETECTION

BACKGROUND

1. Field of the Invention

The present invention relates generally to integrated circuit manufacture; and more particularly to a non-invasive, in-situ method and apparatus for detecting end-point of etch processes.

2. Description of the Related Art

A pervasive trend in modern integrated circuit manufacture is to produce transistors having feature sizes as small as possible. To produce a high-density integrated circuit efficiently, semiconductor processes include the production of complex circuits on a single monolithic substrate, thereby allowing relatively large circuit systems to be incorporated on a single and relatively small die area. Further, many such die are commonly produced on a single wafer which, after production, is diced into the plurality integrated circuits.

The benefits of high-density circuits can only be realized if advanced processing techniques are used. For example, semiconductor process engineers and researchers often study the benefits of electron beam lithography and x-ray lithography to achieve the higher resolutions needed for sub-micron features. To some extent, wet etch has given way to a more advanced anisotropic (dry etch) technique.

Plasma etching and related dry etch processes such as reactive ion etching are becoming increasingly important in the field of semiconductor device manufacture. In general, these processes involve the exposure of one or more wafers containing a number of semiconductor devices to a chemical atmosphere that has been ionized by the application of radio frequency energy. The usual goal of such processes is to remove exposed portions of an underlying layer while leaving an overlying layer. The overlying layer is typically a patterned photoresist and remaining portions of the underlying layer form features of the integrated circuit.

As the feature size of devices manufactured by these processes becomes smaller, it becomes increasingly necessary to accurately define the endpoint of the etching process. The end point is the point at which the desired portions of the underlying layer have been removed by the plasma introduced into the chamber holding the semiconductor wafer. One method of performing endpoint detection is generally referred to as laser endpoint detection and involves the illumination of a predetermined portion of the wafer with energy from a laser and the analysis of the reflected energy.

Laser endpoint detection is fundamentally an interferometric technique. Accordingly, it requires an optical window for monitoring the ongoing etch process. By way of example, in a parallel plate type of plasma reactor wherein a semiconductor wafer is placed upon a bottom plate and wherein a second plate is placed above the wafer to define a space for the induction of a plasma, an optical window is located to be aligned with the defined space. An optical measuring device, by way of example, a chromator, is placed adjacent to the window for measuring a specified radio frequency generated by the plasma and the wafer during the etch process. The chromator is used to detect a specified frequency threshold of the reflected energy from the laser beam.

The specified frequency threshold is a specified frequency of a radio frequency light beam emitted during the dry plasma etch process. The actual frequency of the emitted light is a function of the exposed semiconductor material.

The end point detection (the point at which a semiconductor circuit is adequately etched) occurs when exposed portions of an underlying layer on the wafer is completely etched away. End point for a batch of wafers occurs when exposed portions of the underlying layer being etched is completely etched away at its thickest point on the wafer. Thus, if etching is terminated prior to actual end point, the thickest portion of the exposed underlying layer being etched will remain on the wafer. If etching is terminated after end point, over-etching will occur and over-etching consequences will occur. For example, undercutting of "non-etch" regions may occur which often affects the speed distribution of the part being etched, even for undercutting of as little as fifty angstroms.

A problem with this process is that a misalignment of the chromator with respect to the window can have detrimental effects in that the etch process controls do not function properly. The reason is that a misaligned chromator can miss endpoint because it fails to detect the specified frequency from the reflected laser beam.

The consequences of a misaligned chromator can be severe. In some instances, a misaligned chromator can result in the endpoint of the etch process being detected up to a second late. Late detection of the endpoint thus results in an etch process being continued after it should have been terminated. The result is that the wafer is subjected to excessive etching. The excessive etching, at a minimum, reduces operational reliability. More significantly, the excessive etching can result in the semiconductor wafer being ruined or scrapped. As a typical semiconductor wafer can be worth $20,000 to $60,000, and a single lot of wafers can be worth $1,500,000, the economic consequence of a misaligned chromator is significant. Over the course of a year, the cumulative effect of occasionally misaligned chromators can be dire.

A misaligned chromator can also result in monitoring equipment merely misdiagnosing a wafer as being a defective wafer based upon measurement results. A good wafer may thus be discarded in such a situation once again resulting in huge economic waste. Thus, there exists a need in the art for an improved apparatus and method for monitoring the endpoint of an etch process that reduces the likely hood of misalignment.

SUMMARY OF THE INVENTION

One cause of chromator misalignment described above is related to the physical characteristics of the placement of the chromator. More specifically, the chromator is a bulky device that is large enough to easily be bumped by an individual and small enough to be easily moved when bumped. One common reason for chromator to become misaligned is that their juxtaposed placement over the chamber window subjects the chromator to being bumped and knocked out of alignment. In practice, chromator are bumped frequently. One reason is that the chambers are often co-located with a plurality of other chambers. The plurality of chambers are often placed in a manner that, relative to each other, creates narrow passageways. Additionally, because many etching chambers are built upon a wheeled chassis, it is likely that a chamber will be moved to further reduce a passageway created by the plurality of moveable chambers. This, then, significantly increases the likelihood that the chromator will be bumped and knocked out of alignment.

Additionally, common designs for the mounting of chromator do not include mechanical structures that secure the chromator and that allow the placement of the secure chromator to be adjusted. Instead, common designs allow for three-dimensional adjustment of a window lens through which the chromator monitors the endpoint of the etch process. Additionally, the light passed through the adjustable lens is reflected off of an adjustable mirror. Typically, a given light beam passes through the adjustable lens where it is reflected approximately 90 degrees by the adjustable mirror. Because the mirror also can be adjusted in any one of three axes or dimensions, the optimal alignment of a chromator, the lens and the mirror is a challenging task that invites misalignment.

The problems outlined above are, in large part, solved by placing the chromator in a remote location where it is not likely to be bumped. Fiber optic cabling connects the remote chromator to a bracket mounted over the window used for monitoring the etch process. The bracket that secures the fiber optic cable to the window is adjustably mounted on the chamber in which the etch process takes place so that the cable may be vertically adjusted so as to optimize alignment of the cable. Such alignment will tend to optimize end point detection. The manner of optically coupling the fiber optic cable to the chamber window is additionally advantageous in that it removes the need for having an adjustable lens and an adjustable mirror.

Accordingly, the present invention simplifies the optical path from the chamber window to the chromator. Additionally, it reduces the likelihood that chromator misalignment that can be introduced as a result of an accidental bump. The improved system thus improves endpoint detection and reduces the frequency of good wafers being misdiagnosed as defective wafers. This improved performance thus will certainly result in significant savings. Additionally, because it reduces the likelihood of even small amounts of over etching, a wafer manufacturing process will likely produce more reliable and better quality integrated circuits. These and other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE DRAWINGS

Figure 1:
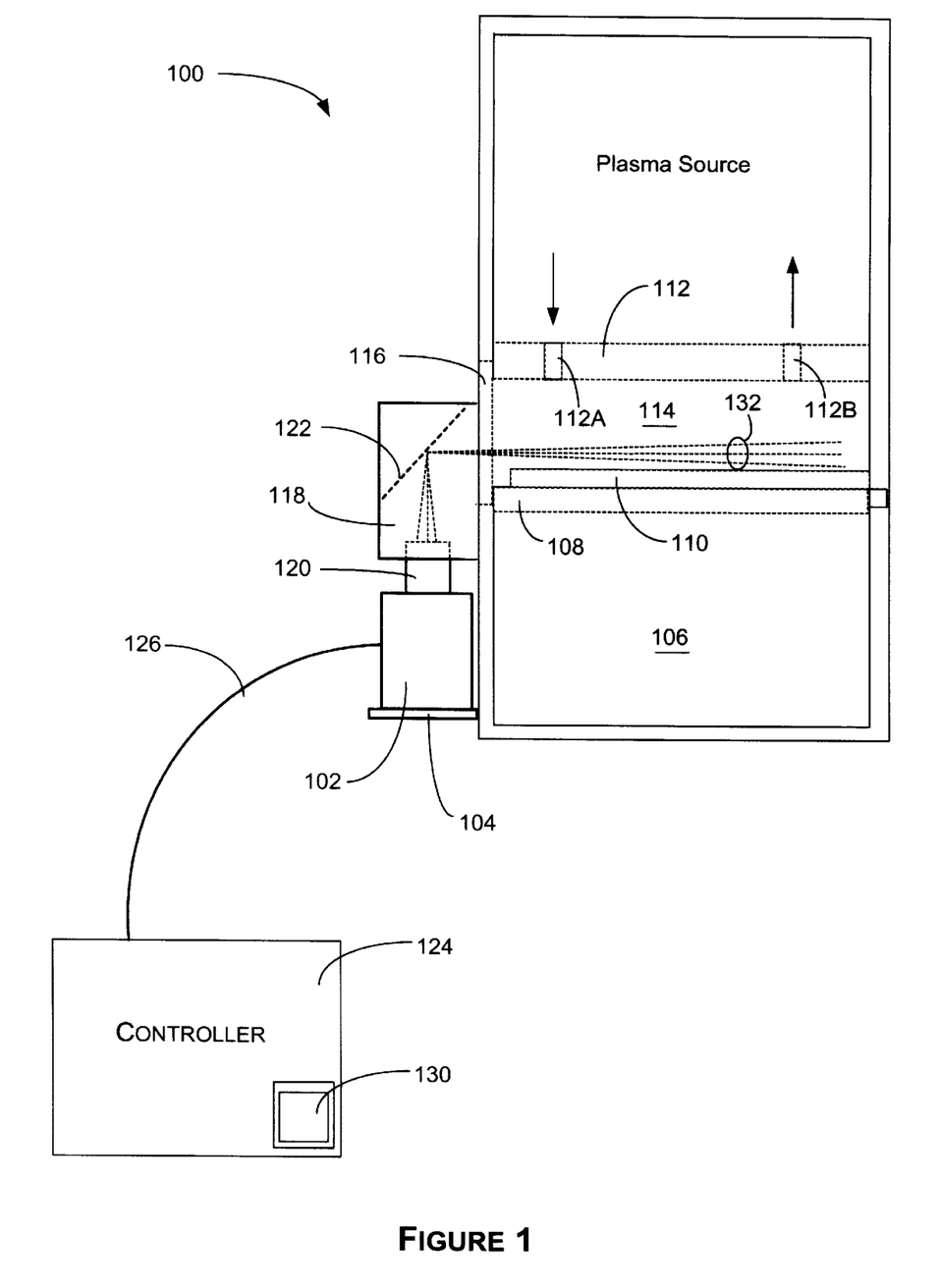
FIG. 1 is a functional block diagram of a system for monitoring an etch process in a chamber.

FIG. 1 is a functional block diagram of a system for monitoring an etch process in a plasma etching chamber. Referring now to the system shown generally at 100, a mono-chromator (chromator) 102 is mounted on a platform 104 which is fixedly attached to the side of a plasma etching chamber 106 used for etching semiconductor wafers. Chamber 106 includes a bottom plate 108 for holding the semiconductor wafer 110 during the etching process. Above bottom plate 108 is top plate 112. Top plate 112 is for defining a chamber area 114 in which plasma is generated for etching the semiconductor wafer 110.

Etching chamber 106 also includes a window 116 for allowing a chromator to take specific readings of light emitted within plasma chamber area 114. As may be seen, a lens receptacle 118 for blocking external light and for protecting a chromator lens 120 from dust particles and other pollutants is attached to the side of chamber 106 in approximate alignment with window 116. Camera lens receptacle 118 includes a mirror 122. Lens 120 is vertically adjustable and mirror 122 is adjustable in any one of three different axes of direction. Lens 120 and mirror 122 are designed to be adjustable in so that an optimal light path from chamber area 114 can potentially be found so that the endpoint of a plasma etching process may be detected.

As may be seen, chromator 102 is coupled to controller 124 by line 126. Controller 124 is for terminating the etching process within etching chamber 106 whenever chromator 102 detects a light beam of a specified frequency. Controller 124 includes a terminal 128 for allowing an operator of the plasma-etcher machine to visually inspect or monitor the etching process.

In operation, chromator 102 is placed to receive light beams 132 from chamber area 114. While the system shown in FIG. 1 includes a chromator placed to receive light beams 132 being transmitted in a downward direction, it is also common to place chromators in a manner that they receive light beams 132 being emitted directly from plasma chamber 114 through window 116.

Light beams 132 are emitted as a product of the plasma etching process. The chromator receives light beams 132 and transmits signals to controller 124 for analysis thereon. Once controller 124 determines that a light beam with a specified frequency is being emitted as the product of the plasma etching process, it concludes that the endpoint has been reached and that the etching process should be terminated. Accordingly, controller 124 generates signals to terminate the etching process as is known to those skilled in the art. While the system of FIG. 1 includes a controller that is separate from chromator 102, it is to be understood that controller 124 could also be placed within chromator 102 as a part of its circuitry.

Figure 2:
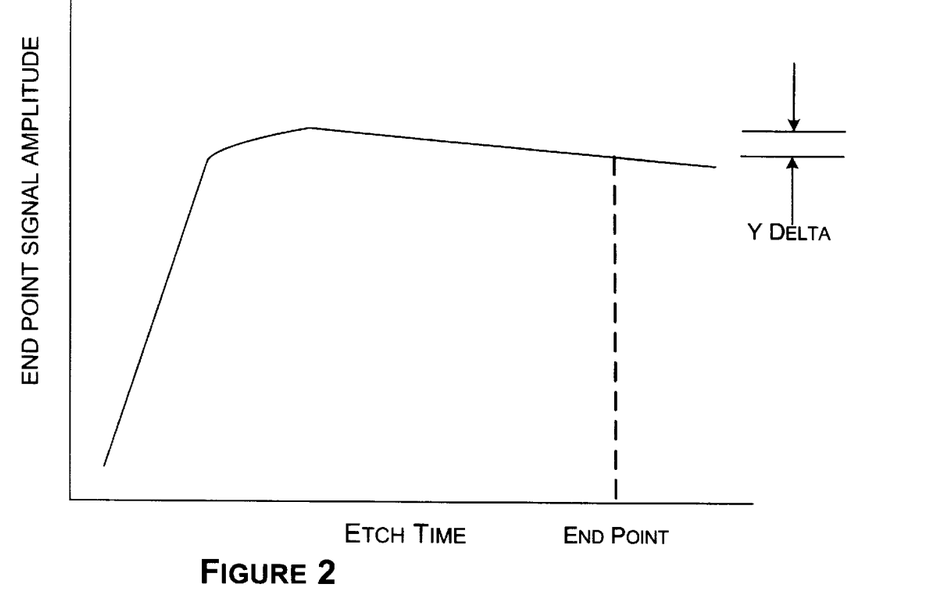
FIG. 2 is a curve that illustrates the relationship between etch time and the amplitude of an endpoint signal caused by the frequency of light beams emitted as a part of the etch process.

FIG. 2 is a curve that illustrates the relationship between etch time and the amplitude of the endpoint signal. More specifically, FIG. 2 illustrates the end point signal amplitude 132 that is measured during the dry plasma etch process. Referring now to FIG. 2, it may be seen that the etching process end point is determined after the amplitude of the end point signal has dropped a specified amount from its amplitude during the etching process. In FIG. 2, the specified amount is represented as "Y Delta". A typical value for Y Delta is five percent. In other words, a five percent drop in the amplitude of the end point signal emitted during the dry plasma process is indicative that the end point has been reached and that the etch process should terminate. It is understood, of course, that the end point is subject to operator control and that it may be varied according to the circumstance or desired etching levels for a specified semiconductor wafer.

As may be seen, the slope of the frequency response curve is very flat and largely horizontal. As a result, it is important for a chromator to be properly aimed so as to detect that Y Delta drop in amplitude when it is reached. A misaligned chromator may miss detection of the end point by only a small frequency amount and yet allow the etch process to continue for an unacceptably long period of time due to the horizontal and flat nature of the curve shown in FIG. 2.

Figure 3:
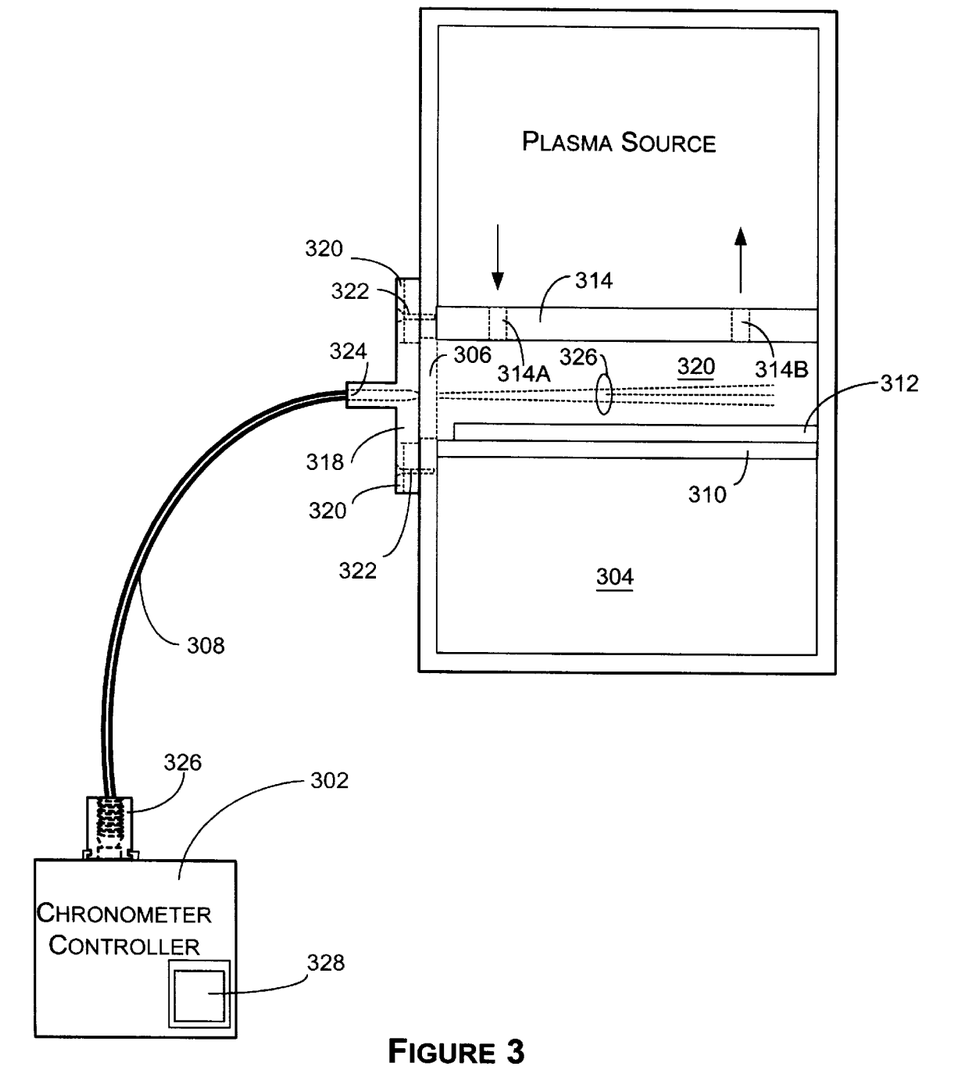
FIG. 3 is a functional block diagram of a system for monitoring an etch process in a chamber according a preferred embodiment of the invention.

FIG. 3 is a functional block diagram of a system for monitoring an etch process in a chamber according to a preferred embodiment of the invention. Referring now to FIG. 3, a mono-chromator (chromator) 302 is mounted remotely from an etching chamber 304 for etching semiconductor wafers. While FIG. 3 shows that that chromator 302 is mounted remotely from chamber 304, the chromator may be mounted on any side or location of the etching chamber 304 for the purpose of this invention.

Significantly, chromator 302 is placed or mounted anywhere except outside of window 306 of chamber 304.

As may be seen, chromator 302 is optically coupled to window 306 by fiber optic cable bundle 308 to monitor and detect the frequency and light waves emitted during the etch process within chamber 304. Fiber optic cable bundle 308, in the preferred embodiment, is a cable bundle having seven fiber optic cables. Chamber 304 includes a chuck 310 for holding the semiconductor wafer 312 during the etching process. Above chuck 310 is top plate 314. Top plate 314 is for defining a chamber area 316 in which plasma is created for etching the semiconductor wafer.

Continuing to refer to FIG. 3, a stationary bracket 318 is adjustably mounted over window 306 on the side of chamber 304 juxtaposed with respect to the window 306. Stationary bracket 318 forms a plurality of vertically oriented screw slots 320 for receiving a plurality of screws 322. Screw slots 320 are vertically oriented so as to allow vertical adjustment of stationary bracket 318 prior to final tightening of screws 322. Accordingly, an operator may vertically adjust stationary bracket 318 so as to allow the optically coupled chromator 302 to optimally detect the end point of the dry plasma etching process. Stationary bracket 318 forms a fiber optic cable bundle receptacle 324 for receiving fiber optic cable bundle 308.

The opposite end of fiber optic cable bundle 308 also is connected to a stationary bracket 326. Stationary bracket 326 is for connecting the fiber optic cable bundle 308 to a standard chromator that is ordinarily mounted over an etching chamber window. Also as may be seen, chromator 302 includes a display 328 for displaying etching process information for viewing by an operator.

In operation, radio frequency light beams 330 generated by the dry plasma etching process pass through window 306 and into fiber optic cable bundle 308. The light beams 326 then are passed through to chromator 302 where they are analyzed to determine whether the end point has been reached.

Figure 4:
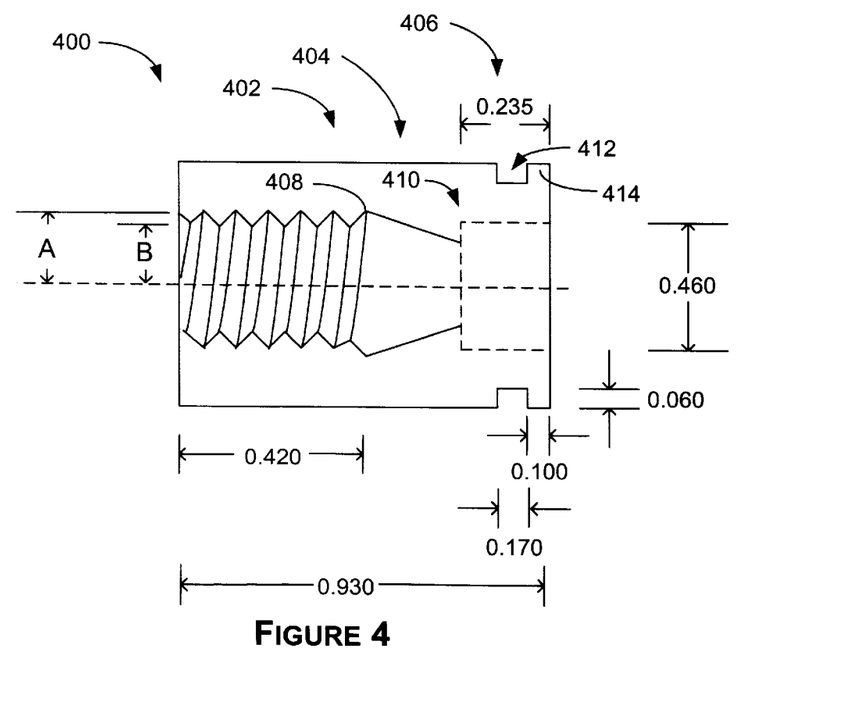
FIG. 4 is a sectional side view of a socket for receiving a fiber optic cable and for connecting the fiber optic cable to a chromator controller.

FIG. 4 is a cutaway view of a socket for receiving a fiber optic cable and for connecting the fiber optic cable to a chromator controller. Referring now to FIG. 4, a fiber optic cable bundle socket shown generally at 400 includes three internal portions which, in combination, serve to optically couple the chromator controller to the fiber optic cable bundle. First, internal portion 402 is formed as passage in the shape of a screw to receive and secure the fiber optic cable bundle. As the first portion 402 is formed in the shape of a screw, it includes a minimum radius and a maximum radius. The maximum radius, shown generally at A in FIG. 4, is approximately 0.25 inches long. The minimum radius, shown generally at B, is shorter than the maximum radius and, when formed in the shape of a screw, is designed to create radial teeth that can securely grab the fiber optic bundle. By way of example, one good minimum radius is 0.20 inches. In the preferred embodiment of the invention, the first portion is 0.420 inches long.

The shape of the first portion allows a fiber optic bundle to be received and screwed in where it may be securely held by socket 400.

Second internal portion 404 is a tapered cavity formed in the shape of a cone to guide and direct the fiber optic cable bundle toward an axial center of the socket. The axial length of second portion 404 is approximately 0.4 inches. The first end 408 of the second portion is formed with a radius that is approximately equal to the maximum radius, shown generally at A of FIG. 4, of the first portion 402. The second end 410 of the second portion is formed with a radius that is slightly less than the minimum radius, shown generally at B of FIG. 4, of the first portion 402.

Third internal portion 406 is a bore formed to receive and optically couple the fiber optic cables of the fiber optic bundle to the light beams being emitted by the plasma etching process through a window of the plasma etching chamber. Third portion 406 is, in the preferred embodiment of the invention, formed to be 0.235 inches deep. Its radius is equal, in the preferred embodiment of the invention, to the maximum radius, shown generally at A of the first portion of the socket shown in FIG. 4. One purpose of the third portion 406 is to receive the exposed ends of the fiber optic cables of the fiber optic cable bundle. Accordingly, when the socket 400 is connected to a chromator controller, the light beams carried by the fiber optic bundle may readily be transmitted into the chromator controller for analysis.

Continuing to refer to FIG. 4, socket 400 further forms a notch, shown generally at 412, to allow socket 400 to be securely connected to a commonly configured chromator controller. Accordingly, the invention herein may readily be practiced without required the manufacture of chromator controllers having new hardware interfaces. Rather, the invention herein may readily be practiced with a retrofit kit. In other words, a connector formed as described herein allows one skilled in the art to practice the invention with a minimal amount of change to existing systems. In the preferred embodiment of the invention, notch 412 is 0.060 inches deep and 0.170 inches wide. The placement of notch 412 results in the formation of a lip 414 at the end of socket 400. The width of lip 414, in the preferred embodiment of the invention, is 0.10 inches.

Figure 5:
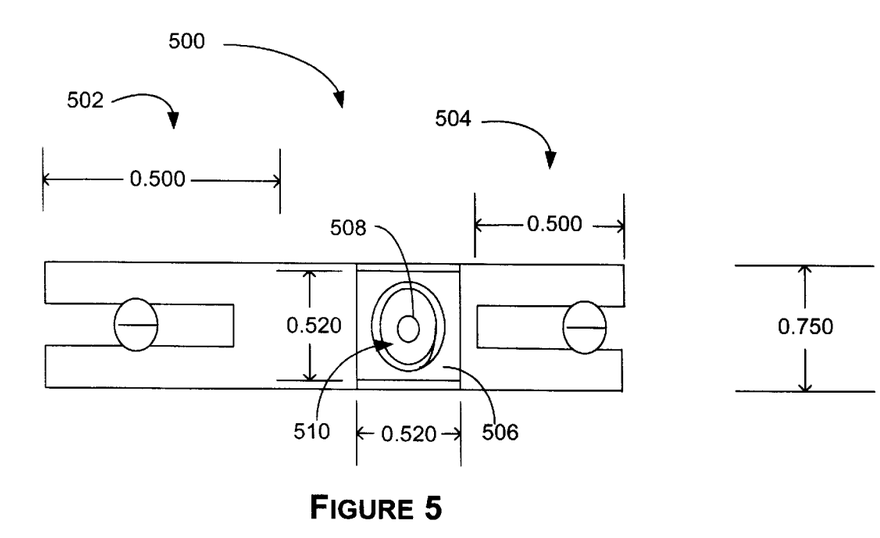
FIG. 5 is a top view of a stationary adjustable bracket according to one aspect of the preferred embodiment of the invention.

FIG. 5 is a top view of a stationary adjustable bracket 500 according to one aspect of the preferred embodiment of the invention. Referring now to FIG. 5, it may be seen that the bracket 500 includes a first and a second slot portions 502 and 504, respectively, and a center portion which includes upright member 506. Upright member 506 is the portion into which a fiber optic cable bundle is connected. The first slot portion 502 is formed by the bracket and is approximately 0.500 inches long in the preferred embodiment of the invention. The second slot portion 504 is formed by the bracket and is approximately 0.350 inches long. The width of the slot portions 502 and 504 is 0.190 inches wide. Functionally, the slot portions 502 and 504 are wide enough to allow the bracket 500 to be axially adjusted without undue resistance from a selected screw being used to mount the bracket to the plasma etching chamber. In the preferred embodiment, upright member 506 is formed to have, from a top view, a square shape wherein the sides are 0.520 inches in length. It is understood, however, that upright member 506 may be made to have different outer shapes. For example, in one alternate embodiment, outer member 506 has a circular shape.

Continuing to refer to FIG. 5, outer member 506 includes a portion 508 that, functionally, is a light passageway that allows light beams to be received within the aperture formed within outer member 506. Portion 508 is formed to be a 0.200 DIP hole. The width of bracket 500 is, in the preferred embodiment, 0.750 inches. Upright member 506 forms an aperture shown generally at 510 for receiving the fiber optic cable bundle.

Figure 6:
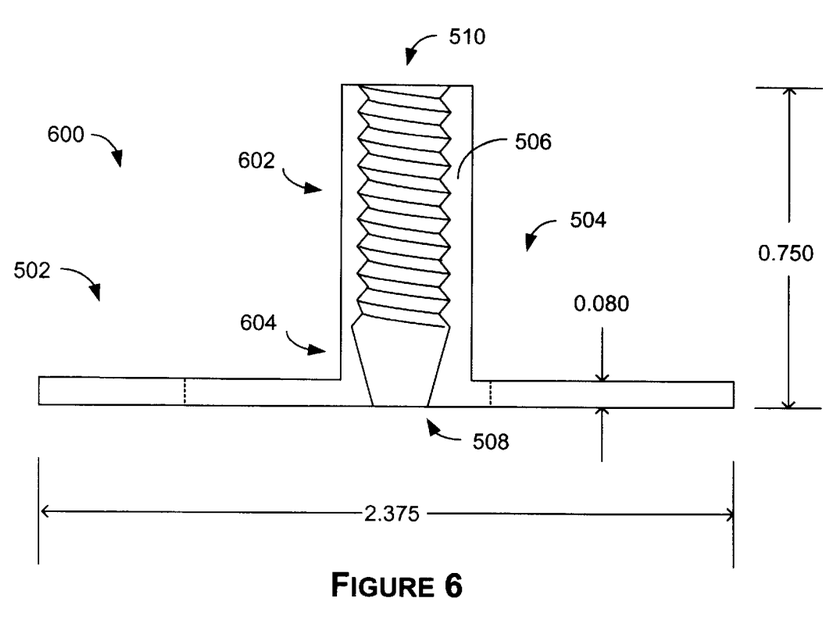
FIG. 6 is a sectional side view of a stationary adjustable bracket according to one aspect of the preferred embodiment of the invention.

FIG. 6 is a sectional side view of a stationary adjustable bracket according to one aspect of the preferred embodiment of the invention. Referring now to FIG. 6, the stationary adjustable bracket is shown generally at 600.

Bracket 600 is the same as bracket 500 of FIG. 5.

Accordingly, the reference numbers from FIG. 5 will be used here for purposes of clarification. As may be seen, upright member 506 is 0.750 inches tall and 2.375 inches long. The thickness of the first 502 and second 504 portions of the bracket 600 at the first 502 and second 504 portions is, in the preferred embodiment, 0.080 inches.

Continuing to examine FIG. 6, upright member 506 includes a first portion 602 and a second portion 604. The aperture shown at 510 of first portion 602 is formed in the shape of a screw. As with the bracket shown in FIG. 4, the first portion 602 of bracket 600 is formed so as to allow the bracket 600 to receive and securely hold a fiber optic cable bundle. The minimum and maximum radii discussed n relation to FIG. 5 are similar to those of the bracket shown in FIG. 6. The minimum radius is designed to create radial teeth that can securely grab the fiber optic bundle. By way of example, one good minimum radius is 0.20 inches.

In the preferred embodiment of the invention, the first portion 602 is 0.420 inches long and the second portion 604 is 0.250 inches long. The shape of the first portion 602 allows a fiber optic bundle to be received and screwed in where it may be securely held by socket 400. The conical shape of the second portion 604 is for guiding the fiber optic cable bundle toward portion 508 so as to optimally receive light beams being transmitted from the plasma gas chamber through the chamber window. It is understood, of course, that the dimensions of each internal portion as described above may be modified without departing from the scope of the invention disclosed and claimed herein.

Figure 7:
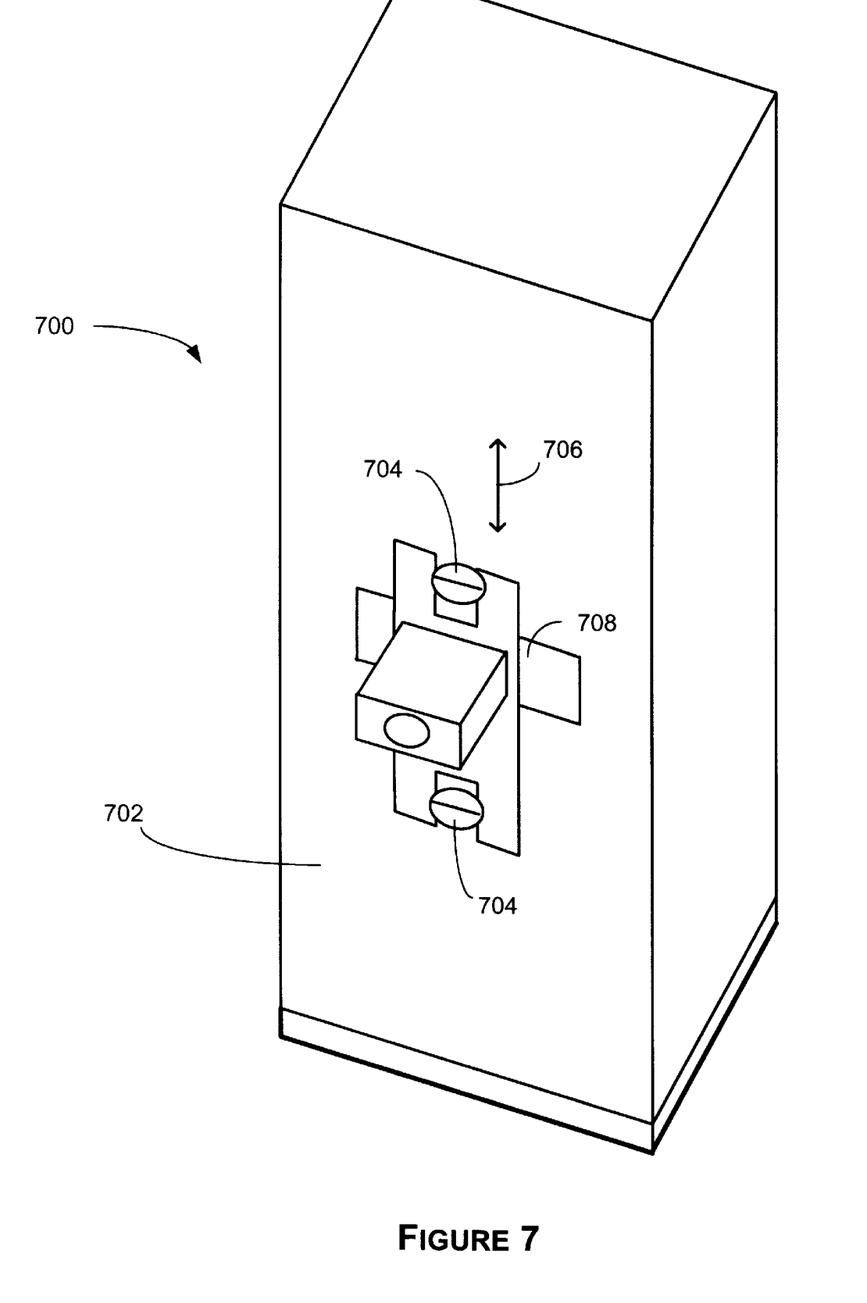
FIG. 7 is a perspective view of a plasma etching chamber having an adjustable stationary bracket attached thereto according to the preferred embodiment of the invention.

FIG. 7 is a perspective view of a plasma etching chamber having an adjustable stationary bracket attached thereto according to the preferred embodiment of the invention. Referring now to FIG. 7, it may be seen that an adjustable stationary bracket shown generally at 700 is attached to a chamber 702. A fiber optic cable bundle is not shown in FIG. 7 for purposes of clarity. It is understood, however, that a fiber optic cable bundle is ordinarily attached to bracket 700.

As may be seen, bracket 700 is stationarily attached to chamber 702 by screws 704. Bracket 700 may be adjustably moved in the vertical directions 706 over window 708. In order to vertically adjust bracket 700, screws 704 must be sufficiently loose to allow vertical translation by bracket 700. Accordingly, once bracket 700 is optimally aligned, screws 704 may be tightened so as to keep bracket 700 in a stationary and fixed optimal position for optimal detection of the end point in the etching process.

For optimal endpoint detection, an operator must vertically adjust bracket 700 while causing a light source to emit light beams in order to obtain a maximum reading by the chromator controller connected thereto by the fiber optic cable bundle. Vertically optimizing the placement of the bracket maximizes the likelihood that the chromator controller will properly detect the end point.

Figure 8:
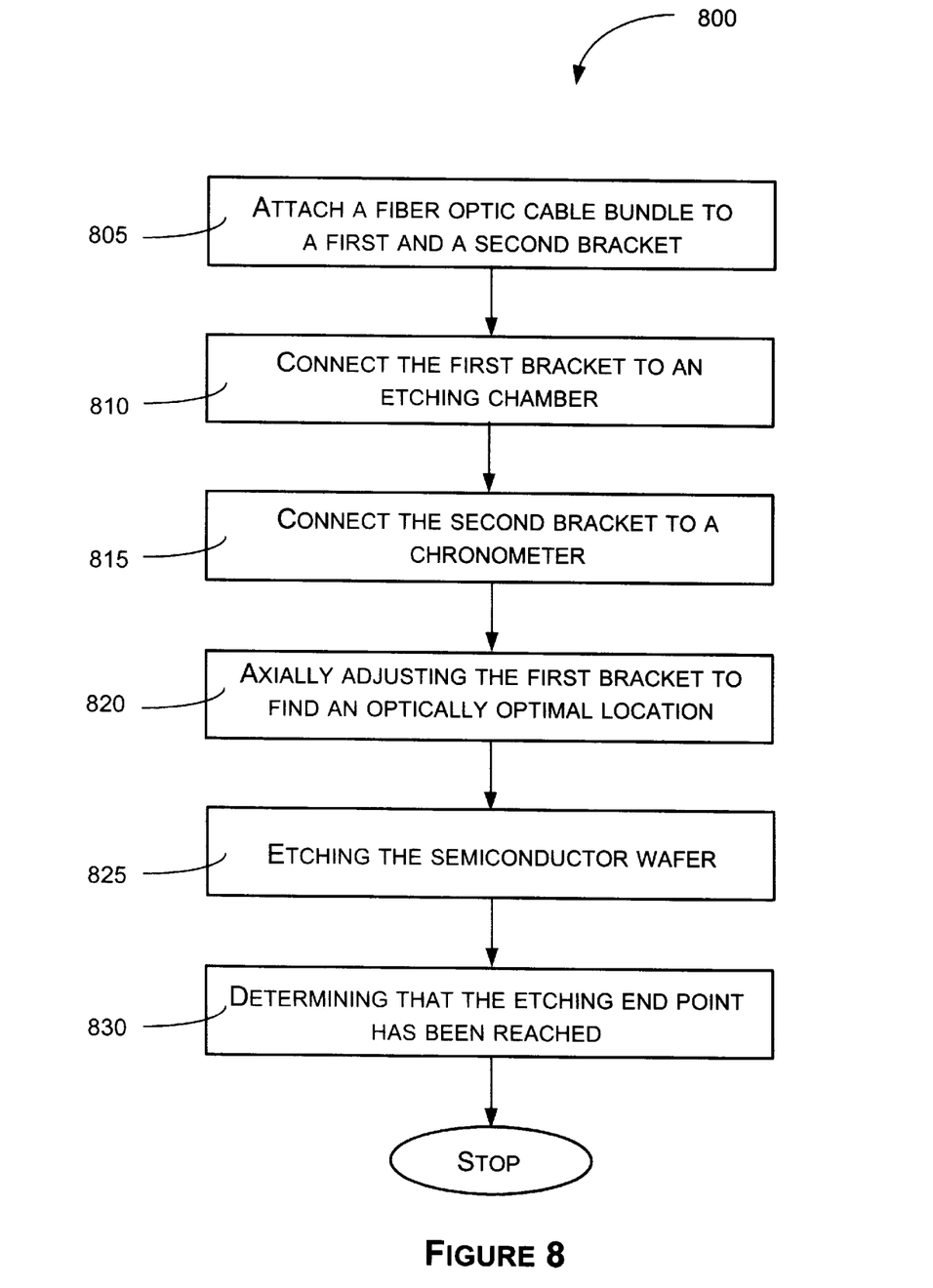
FIG. 8 is a flow chart illustrating a method for etching a semiconductor wafer according to a preferred embodiment of the invention.

FIG. 8 is a flow chart illustrating a method for etching a semiconductor wafer according to a preferred embodiment of the invention. Referring now to FIG. 8, the inventive method shown generally at 800 includes the following steps. First, a fiber optic cable bundle is attached to a first bracket and to a second bracket (step 805). The first bracket is one that is used to optically couple the fiber optic cable bundle to the plasma-etching chamber. The second bracket is one that allows the fiber optic cable bundle to be coupled to a common chronometer controller without requiring hardware modifications.

The first bracket is connected to the plasma-etching chamber and the second bracket is connected to the chronometer controller (step 810). At this point, the chromator is optically coupled to the plasma-etching chamber. The chronomter controller may be placed in any remote location within reach of the fiber optic cable bundle.

With respect to connecting the first bracket to the plasma chamber, the bracket is juxtaposed in an overlapping position in relation to a window of a plasma etch chamber and is mounted to the chamber. As is understood, the window is formed in an aligned position so as to allow monitoring of light beams emitted during a plasma etching process.

Any known type of structures and devices for attaching the bracket to the chamber may be used. In the preferred embodiment, a plurality of screws is used to attach the bracket to the chamber. A requirement for the attaching device is that it should be one that allows the bracket to be axially adjusted and then secured so as to allow the bracket to be secured in an optimal axial location.

After the first bracket is attached to the chamber, the first bracket should be axially adjusted so as to place the fiber optic cable bundle attached to the bracket in an optically optimum position (step 815). Thereafter, the etching of the semiconductor wafer should proceed until the end point is reached (step 820).

Figure 9:
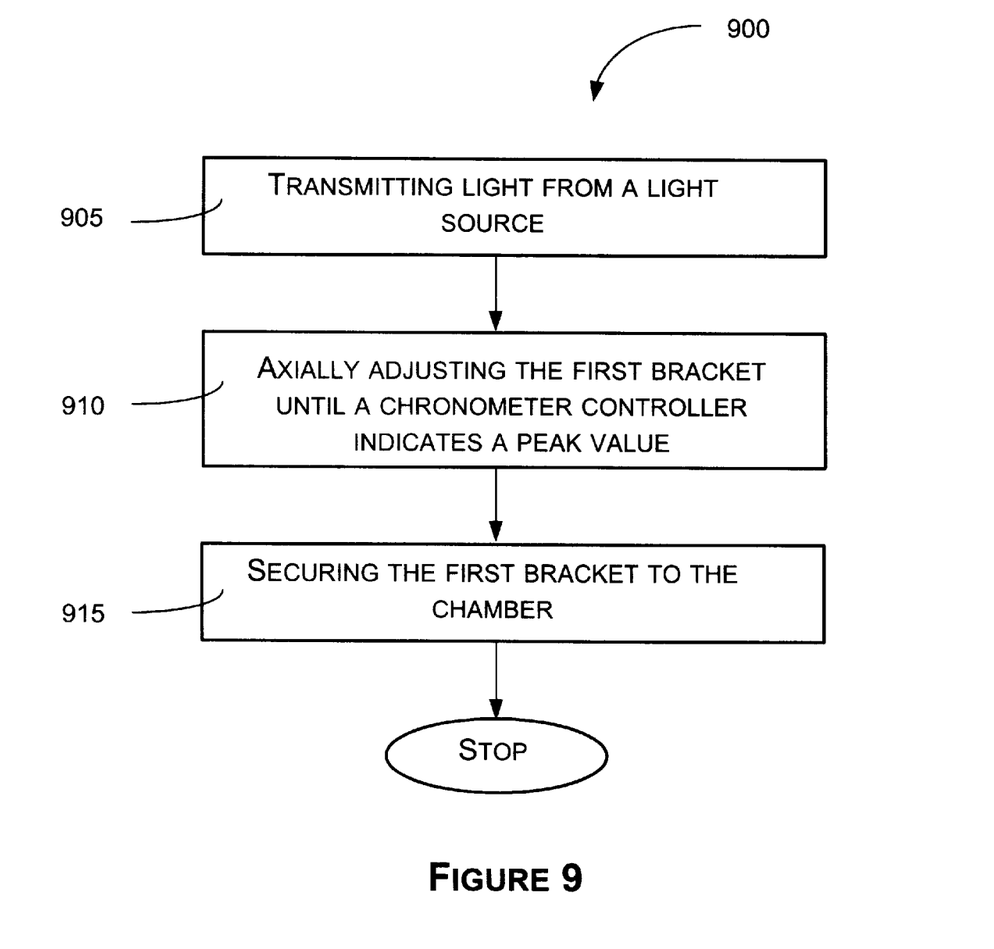
FIG. 9 is a flow chart illustrating a method for optically coupling a chromator to a plasma etching chamber and for finding and maintaining an optimal optical coupling according to a preferred embodiment of the invention.

FIG. 9 is a flow chart illustrating a method for optically coupling a chromator to a plasma etching chamber and for finding and maintaining an optimal optical coupling according to a preferred embodiment of the invention. Referring now to FIG. 9, the inventive method shown generally at 900 includes the following steps.

After the chromator controller is optically coupled to the plasma etching chamber, the first bracket is axially adjusted in a vertical position to obtain an optimal location for determining that the end point has been reached in the etching process(step 905). To find the vertically optimal position, a plasma must be used during the adjustment. The bracket then is vertically adjusted until the chromator controller (step 910) determines a peak value. After the peak value is found, the bracket is secured to the optimal position to prevent movement (step 915).

The invention disclosed herein is susceptible to various modifications and alternative forms. Specific embodiments therefor have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:

1. An apparatus for monitoring for an end point in a plasma etching process, comprising:

a plasma etching chamber having a window;

a chromator for measuring a radio frequency light wave;

a first select bracket attached to the plasma etching chamber in a juxtaposed position overlying the window, the first select bracket being formed to extend outwardly relative to the window a distance that is approximately equal to or less than one inch, wherein the first select bracket further includes a first portion forming radial teeth for securely receiving and holding the fiber optic bundle and a second portion forming a conically shaped receptacle for receiving the fiber optic bundle and for urging the fiber optic bundle to a precise location relative to the bracket and the window;

a fiber optic cable bundle optically coupled to the first select bracket whereby light beams created during the etching process may be transmitted through the window and into the fiber optic cable bundle; and a second select bracket attached to the chromator and optically coupled to the fiber optic cable bundle wherein the chromator is optically coupled to the chamber.

2. The apparatus of claim 1 wherein the first select bracket includes a first portion for securely receiving the fiber optic cable bundle.

3. The apparatus of claim 2 wherein the first select bracket includes a second portion having a conical shape and an opening, the second portion for guiding a fiber optic cable of the fiber optic cable bundle towards the opening whereby the fiber optic cable is positioned to receive light beams being emitted from the plasma etching chamber.

4. The apparatus of claim 1 further including the attaching means.

5. The apparatus of claim 4 wherein the fiber optic cable bundle comprises at least 7 fiber optic cables.

6. The apparatus of claim 4 wherein the attaching means comprises at least one screw.

7. The apparatus of claim 6 wherein the attaching means further includes a slot formed by the first select bracket, the slot for slidably receiving the at least one screw whereby the first select bracket may be axially adjusted.

8. The apparatus of claim 7 wherein the slot is formed to allow the first select bracket to be axially adjusted in a vertical direction.

* * * * *